(12) United States Patent
Motobe et al.

(10) Patent No.: US 8,470,938 B2
(45) Date of Patent: Jun. 25, 2013

(54) RESIN COMPOSITION FOR PRINTED WIRING BOARD, PREPREG, AND LAMINATE OBTAINED WITH THE SAME

(75) Inventors: Hidetsugu Motobe, Osaka (JP); Akinori Hibino, Osaka (JP); Katsuhiko Ito, Osaka (JP)

(73) Assignee: Matsushita Electric Works, Ltd., Osaka (JP)

( * ) Notice: Subject to any disclaimer, the term of this patent is extended or adjusted under 35 U.S.C. 154(b) by 951 days.

(21) Appl. No.: 10/559,556

(22) PCT Filed: Jun. 3, 2003

(86) PCT No.: PCT/JP03/07052
§ 371 (c)(1),
(2), (4) Date: Dec. 2, 2005

(87) PCT Pub. No.: WO2004/108791
PCT Pub. Date: Dec. 16, 2004

(65) Prior Publication Data
US 2006/0159928 A1    Jul. 20, 2006

(51) Int. Cl.
*C08F 283/00* (2006.01)
*B32B 27/04* (2006.01)
*B32B 27/38* (2006.01)

(52) U.S. Cl.
USPC ............................ 525/524; 442/146; 428/413

(58) Field of Classification Search
USPC ............................ 428/413; 525/524; 442/146
See application file for complete search history.

(56) References Cited

U.S. PATENT DOCUMENTS 6,558,797 B1 * 5/2003 Arata et al. .................. 428/418

FOREIGN PATENT DOCUMENTS

| GB | 2362037 | * 11/2001 |
| JP | 5-301980 | 11/1993 |
| JP | 5-304360 | 11/1993 |
| JP | 8-12858 | 1/1996 |
| JP | 2000-154232 | 6/2000 |

OTHER PUBLICATIONS

Computer translation of JP 2000-154232.*
Office Action mailed on May 28, 2008 in U.S. Appl. No. 10/559,321.

* cited by examiner

*Primary Examiner* — Mark Eashoo
*Assistant Examiner* — Megan McCulley
(74) *Attorney, Agent, or Firm* — Faegre Baker Daniels LLP

(57) ABSTRACT

An epoxy resin composition for use in producing a prepreg for printed wiring boards excellent in appearance, flame retardancy, etc., which comprises an epoxy resin, a phenolic novolak, and a curing accelerator. It is characterized in that the epoxy resin comprises an epoxy (a) and an epoxy (b), wherein the epoxy (a) is a brominated epoxy resin which is obtained by reacting/mixing a bisphenol A epoxy resin with tetrabromobisphenol A and has an epoxy equivalent of 350 to 470 g/eq and an n=0 component content of 20 to 35% in terms of areal percentage in a GPC chart, and the epoxy (b) is at least one bifunctional epoxy resin which is obtained by reacting any one selected from the group consisting of bisphenol A, bisphenol F, and tetrabromobisphenol A with epichlorohydrin and has an n=0 component content as determined from a GPC chart of 60% or higher.

14 Claims, No Drawings

RESIN COMPOSITION FOR PRINTED WIRING BOARD, PREPREG, AND LAMINATE OBTAINED WITH THE SAME

FIELD OF INVENTION

The present invention relates to an epoxy resin composition for a printed wiring board used in manufacturing of an electric laminated board or the like, a prepreg for a printed wiring board, as well as a laminated board for a printed wiring board, a printed wiring board and a laminated printed wiring board, using this prepreg, for use in an electronic device.

BACKGROUND OF THE INVENTION

Dicyandiamide (DICY) has been used for a long period of time as a curing agent of epoxy resins for printed wiring boards. However, a material superior in a long term insulation reliability (CAF resistance) and a material with a high decomposition temperature required for lead-free soldering have been demanded as a requirement along with higher density wiring in printed wiring boards in recent years, so that phenol type curing systems superior in these properties have been used as the curing agent. However, in case of using these curing systems, such a problem remains as a glass substrate is not well impregnated and the prepreg prepared is poor in its appearance.

DISCLOSURE OF THE INVENTION

The present invention has been achieved in view of the above problems. It is an object of the present invention to provide an epoxy resin composition for a printed wiring board, used for producing a prepreg, capable of providing a prepreg having good appearance, and providing excellent heat resistances such as a thermal decomposition temperature and heat resistance in an oven, and excellent balance in fire retardancy, glass transition temperature and cost, when used in a general purpose fiber reinforced (FR)-4 printed wiring board; as well as to provide a prepreg prepared therefrom and to provide a laminated board using the prepreg.

With respect to improvement of the appearance of the prepreg, it is described, in Japan Patent Kokai H07-48586 and Japan Patent Kokai H07-68380, that impregnation of an epoxy resin composition into a substrate and appearance of a prepreg are improved by reacting tetrabromobisphenol A with both a bisphenol A type epoxy resin and a novolac type epoxy resin, in manufacturing of a prepreg. The present inventors have studied extensively, in prepregs for printed wiring boards using a general purpose epoxy resin composition, and have reached the present invention, in a different approach from the means mentioned above, finding out an epoxy resin composition capable of providing effective improvement in the appearance of the prepreg for printed wiring boards, with assuring good fire retardancy and glass transition temperature in the prepreg for printed wiring boards.

In accordance with the invention according to claim 1, is provided an epoxy resin composition for a printed wiring board, comprising an epoxy resin, a phenol novolac resin and a curing accelerator, characterized in that said epoxy resin comprises an epoxy (a) and an epoxy (b); wherein the epoxy (a) is a brominated epoxy resin, obtainable by reacting/mixing a bisphenol A epoxy resin with tetrabromobisphenol A, said brominated epoxy resin having an epoxy equivalent of 350 g/eq to 470 g/eq and containing an n=0 component in a ratio of 20% to 35% in terms of area percentage in a GPC chart; and the epoxy (b) is one or more of bifunctional epoxy resins, obtainable by reacting epichlorohydrin with any one selected from the group consisting of bisphenol A, bisphenol F and tetrabromobisphenol A, said bifunctional epoxy resins having an n=0 component in a content of 60% or higher in term of area percentage in a GPC chart; said epoxy (a) and epoxy (b) are contained in total in an amount of 80% to 100% by weight, preferably 93% to 100% by weight, based on the total weight of the epoxy resin; said epoxy (a) is contained in an amount of 75% to 97% by weight, based on the total weight of the epoxy resin; and said epoxy resin has a bromine content of 18% to 30% by weight, based on the total weight of the epoxy resin.

In accordance with the invention according to claim 2, is provided an epoxy resin composition for a printed wiring board according to claim 1, characterized in that the phenol novolac resin is a phenol novolac resin, obtainable by reacting formaldehyde with one selected from the group consisting of phenol, cresol and bisphenol A; said phenol novolac resin containing a bifunctional component in an amount of 15% to 30%.

In accordance with the invention according to claim 3, is provided an epoxy resin composition for a printed wiring board according to claim 1 or 2, characterized in that an inorganic filler is contained.

In accordance with the invention according to claim 4, is provided an epoxy resin composition for a printed wiring board described in claim 3, characterized in that a glass powder and/or silica filler is contained.

In accordance with the invention according to claim 5, is provided a prepreg for a printed wiring board, characterized in that the prepreg is obtainable by impregnating a glass cloth with a varnish comprising an organic solvent and an epoxy resin composition for a printed wiring board according to any one of claims 1 to 4 and drying the vanish to B-stage.

In accordance with the invention according to claim 6, is provided a laminated board for a printed wiring board, a printed wiring board or a laminated printed wiring board, characterized in that a prepreg for a printed wiring board according to claim 5 is used for the preparation thereof.

BEST MODE FOR CARRYING OUT THE INVENTION

Embodiments of the present invention are described bellow.

It is essential in this invention that the epoxy resin used therein is comprised of an epoxy (a) and an epoxy (b), wherein the epoxy (a) is a brominated epoxy resin, obtainable by reacting/mixing a bisphenol A epoxy resin with tetrabromobisphenol A, said brominated epoxy resin having an epoxy equivalent of 350 g/eq to 470 g/eq and containing an n=0 component in a ratio of 20% to 35% in terms of area percentage in a GPC chart; and the epoxy (b) is one or more of bifunctional epoxy resins, obtainable by reacting epichlorohydrin with any one selected from the group consisting of bisphenol A, bisphenol F and tetrabromobisphenol A, said bifunctional epoxy resins having an n=0 component in a content of 60% or higher in term of area percentage in a GPC chart; said epoxy (a) and epoxy (b) are contained in total in an amount of 80% to 100% by weight, preferably 93% to 100% by weight, based on the total weight of the epoxy resin; said epoxy (a) is contained in an amount of 75% to 97% by weight, based on the total weight of the epoxy resin; and said epoxy resin has a bromine content of 18% to 30% by weight, based on the total weight of the epoxy resin.

The epoxy resin composition for the printed wiring board used in the invention has to be comprised of an epoxy resin as mentioned above, a phenol novolac resin, and a curing accelerator.

Besides the components mentioned above, the epoxy resin composition for the printed wiring board is preferably formulated with an inorganic filler in order to reduce the coefficient of thermal expansion of the cured product. In addition to the components mentioned above, an ultraviolet light screener, a fluorescent agent or the like can be formulated as needed.

Said epoxy (a) is not particularly limited, so far as it is a brominated epoxy resin obtainable by mixing and reacting the bisphenol A type epoxy resin with tetrabromobisphenol A, has the epoxy equivalent from 350 g/eq to 470 g/eq and comprises the component n=0 with the relative area from 20% to 35% in the GPC. Specifically, there may be mentioned BEB530A80 from Chan Chun Synthetic Co. and EPICLON 1320-80A from WUXI DIC EPOXY Co. Ltd. If the epoxy equivalent is less than 350 g/eq, a cured product becomes hard. On the other hand, if the epoxy equivalent is above 470 g/eq, the glass transition temperature of the cured product might be lowered in some cases. When the relative area of the component n=0 in the GPC becomes less than 20%, the appearance of the prepreg possibly becomes poor. On the other hand, if the relative area of the component n=0 exceeds 35%, a flow of the resin possibly becomes high.

The relative area of the component n=0 in the GPC is measured with the following method.
(Measurement of GPC: Gel Permeation Chromatography)

A measurement was performed under the conditions such that a solvent was tetrahydrofuran (THF), a column in a combination of G4000HXL, G3000HXL, G2000HXL and G2000HXL from Toyo Soda Co. Ltd., a flow rate at 1 ml/min. and a detector with a refractive index (RI) detector.

Said epoxy (b), a bifunctional epoxy resin is not in particular limited, so far as it is a bifunctional epoxy resin obtainable by reacting any one of bisphenol A, bisphenol F or tetrabromobisphenol A with epichlorohydrin and comprises 60% or more of the component n=0 in the relative area in the GPC; and two kinds thereof can be used in combination. Specifically, there may be mentioned EPICLON 153 (brominated epoxy resin) and EPICLON 840S (bisphenol A type epoxy resin) from Dainippon Ink and Chemical Industries, Ltd. and the like.

Using said epoxy (a) and epoxy (b) in total in an amount of 80% to 100% by weight, preferably 93% to 100% by weight, and epoxy (a) in an amount of 75% to 97% by weight, based on the total weight of the epoxy resin, lead to a desirable glass transition temperature of the cured product and to a satisfactory result in the appearance of the prepreg. Furthermore, adjusting a bromine content impregnated within the range of 18% to 30% by weight, based on the total weight of the epoxy resin, assures the fire retardancy (V-0 rating in UL specification) in the cured product.

Besides the above epoxy (a) and (b), in this invention, one or more other epoxy resins may be used. These epoxy resins are not particularly limited, but include, for example, novolac type epoxy resins, such as cresol novolac type epoxy resins; dicyclopentadiene type epoxy resins; biphenyl type epoxy resins, such as bifunctional tetramethylbiphenyl type epoxy resins; polyfunctional epoxy resins, such as trifunctional epoxy resins, and tetrafunctional epoxy resins, and hydroquinone type epoxy resins.

Phenol novolac resins, used as a curing agent in the invention, are not particularly limited. Phenol novolac resins, containing a bifunctional component in an amount of 15% to 30%, obtainable by reacting formaldehyde with any one of phenol, cresol and bisphenol A, are preferred in view improved moldability of the prepreg produced therefrom. In addition, as an equivalent ratio of the epoxy group to the phenolic hydroxyl group ranges from 1:1.2 to 1:0.7, the glass transition temperature in the cured product is desirably well balanced with the peal strength and other properties.

Preferable organic solvents, used in the present invention, include ketones, such as methyl ethyl ketone, and cellosolves, such as methoxypropanol.

Curing accelerators used in this invention are not particularly limited, but include, for example, imidazoles, such as 2-methylimidazole, 2-ethyl-4-methyl-imidazole, 2-phenylimidazole and 1-cyanoethyl-2-ethyl-4-methylimidazole; tertiary amines, such as benzyldimethylamine; organic phosphines, such as tributylphosphine and triphenylphosphine; and imidazolesilanes. These can be used singly or in combination.

Inorganic fillers used in the invention, which are not particularly limited, include, for example, aluminum hydroxide, magnesium hydroxide, talc, burned (calcined) talc, kaolin, burned (calcined) kaolin, clay, burned (calcined) clay, natural silica, synthetic silica, glass powder and the like. Preferred are silica and glass powder. Furthermore, these fillers are preferably surface-treated with a silane coupling agent so as to increase interfacial strength between the resin and the filler. In addition, inorganic fillers preferably have an average particle diameter of 0.3 μm to 30 μm. As fillers have an average particle diameter exceeding 30 μm, a filter could possibly be clogged in filtering process in order to eliminate foreign particles in a varnish. Furthermore, inorganic fillers are preferably added in an amount of 5 pbw (parts by weight) to 70 pbw per 100 pbw of the solid resin. In addition, use of glass power or silica as the filler is preferred, since it is capable of reducing the coefficient of thermal expansion in the cured product with only slight decrease of the glass transition temperature in the cured product.

Manufacturing of the prepreg is described below.

A curing agent, a curing accelerator and an organic solvent are formulated with an epoxy resin as mentioned above, followed by uniformly mixing them with a mixer and optionally with a NanoMill grinding mill to prepare an epoxy resin composition for printed wiring board.

A glass cloth is impregnated with the resulting epoxy resin composition for printed wiring board, followed by drying it within an oven (120 to 180° C.) for the curing time being from 60 seconds to 180 seconds to yield a prepreg in the semi-cured state (B-stage) for printed wiring board.

Then, a desired number of the prepreg sheets prepared as mentioned above are stacked and hot-pressed at 140 to 200° C. and 0.98 to 4.9 MPa by laminate molding to yield a laminated board for printed wiring board. During this process, a metal foil can be placed on one side or both sides of the desired number of the prepreg sheets stacked for printed wiring board, followed by laminate molding to yield a metal foil clad laminated board, which is fabricated to a printed wiring board. As the metal foil, a copper foil, silver foil, aluminum foil, stainless steel foil or the like can be used.

Then, a printed wiring board can be prepared by formation of a circuit (pattern formation) on the outside of the laminated board for printed wiring board prepared as mentioned above. Specifically, for example, circuit can be formed by application of a subtractive method to the metal foil of the outside on the metal foil clad laminated board or of an additive method in case of a non-metallic outside on the laminated board, completing a printed wiring board.

Furthermore, a laminated printed wiring board can be prepared by laminate molding using at least any one of the prepreg for printed wiring board, the laminated board for the printed wiring board, and the printed wiring board. Specifically, for example, a printed wiring board, which is formed and completed with a circuit as mentioned above, is used as a substrate board for inner layer and a desired number of prepreg sheets for printed wiring board are stacked on one side or both sides of this substrate for inner layer as well as a metal foil is placed on the outside of the prepregs and then the stacked sheets are hot-pressed by laminate molding to yield a laminated printed wiring board. In this process, the molding temperature is preferably set within the range of 150 to 180° C.

Printed wiring boards and the like, finally obtained in accordance with the present invention, are well balanced in fire retardancy, cost, glass transition temperature, and high heat resistance.

The present invention is specifically described with examples in the following.

At first, epoxy resins [epoxy (a), epoxy (b), and other epoxy resin], a curing agent, an inorganic filler, a curing accelerator, and an organic solvent are given in this order.

Epoxy resins used are as follows.

The followings are used as the epoxy (a): a brominated epoxy resin, obtainable by reacting/mixing a bisphenol A epoxy resin with tetrabromobisphenol A, and having an epoxy equivalent of 350 g/eq to 470 g/eq and containing an n=0 component in a ratio of 20% to 35% in terms of area percentage in a GPC chart:
  Epoxy 1: Dow Chemical Co. DER530A80
    Epoxy equivalent=427 g/eq and the n=0 component=28%.
  Epoxy 2: WUXI DIC EPOXY Co. Ltd. Epiclon 1320A80
    Epoxy equivalent=430 g/eq and the n=0 component=26%.
  Epoxy 3: Chan Chun Synthetic Co. BEB530A80
    Epoxy equivalent=438 g/eq and the n=0 component=27%
  Epoxy 4: Grace Co. GER454A80
    Epoxy equivalent=435 g/eq and the n=0 component=27%.
  Epoxy 5: Dow Chemical Co. DER539A80
    Epoxy equivalent=450 g/eq and the n=0 component=21%.
  Epoxy 6: Dainippon Ink and Chemical Industries Ltd. Epiclon 120-80M
    Epoxy equivalent=500 g/eq and the n=0 component=17% (for comparison).

The followings are used as the epoxy (b): a bifunctional epoxy resin, obtainable by reacting epichlorohydrin with any one of bisphenol A, bisphenol F and tetrabromobisphenol A:
  Epoxy 7: Dainippon Ink and Chemical Industries Ltd. Epiclon 153
    Brominated epoxy resin, epoxy equivalent=400 g/eq and the n=0 component=68%
  Epoxy 8: Dainippon Ink and Chemical Industries Ltd. Epiclon 840S
    Bisphenol A type epoxy resin, epoxy equivalent=190 g/eq and the n=0 component=86%
  Epoxy 9: Dainippon Ink and Chemical Industries Ltd. Epiclon 830S
    Bisphenol F type epoxy resin, epoxy equivalent=170 g/eq and the n=0 component=78%.

The followings are used as the other epoxy resins:
Epoxy 10: Shell Chemical Co. EPON Resin 1031
  Tetrafunctional epoxy resin, epoxy equivalent=212 g/eq.
Epoxy 11: Toto Chemical Co. YDCN-704
  Cresol novolac type epoxy resin, epoxy equivalent=220 g/eq.
As the curing agent, the followings are used.
Curing agent 1: Japan Epoxy Resin Co. YLH129B70
  Bisphenol A type novolac epoxy resin, bifunctional component=17-19% and equivalent of hydroxyl group=118 g/eq.
Curing agent 2: Dainippon Ink and Chemical Industries Ltd TD-2093
  Phenol type novolac epoxy resin, bifunctional component=7-8% and equivalent of hydroxyl group=105 g/eq.
Curing agent 3: Dainippon Ink and Chemical Industries Ltd. VH-4170
  Bisphenol A type novolac epoxy resin, bifunctional component=25% and equivalent of hydroxyl group=118 g/eq.
Curing agent 4: Dicyandiamide, reagent grade, theoretical equivalent of active hydrogen=21 g/eq.
As the curing accelerator, the following is used.
Accelerator 1: Shikoku Chemicals Corp. 2-Ethyl-4-methylimidazole.
As the inorganic filler, the followings are used.
Inorganic filler 1: E-glass powder, S.S.J. Betrotex Corp. REV1, fiber diameter=13 μm and fiber length=35 μm.
Inorganic filler 2: Silica, Tatsumori Co., Kicross MSR-04, spherical silica, average particle diameter=4 μm.
Inorganic filler 3: Talc, Fuji Talc Co., burned, PKP-81, average particle diameter=130 μm.
As the organic solvent, the followings are used.
Organic solvent 1: Methyl ethyl ketone.
Organic solvent 2: Methoxypropanol.
Organic solvent 3: Cyclohexanone.
Organic solvent 4: Dimethylformamide.

Example 1

Epoxy 1 (112.5 pbw) and Epoxy 7 (10 pbw) as the epoxy resin, Curing agent 1 (39.5 pbw) as the curing agent, and Organic solvent 2 (18.6 pbw) as the organic solvent were mixed and stirred for approximately 90 minutes, followed by adding thereto Accelerator 1 (0.13 pbw) as the curing accelerator and stirring them for 30 minutes to yield a varnish.

Example 2

Epoxy 2 (118.8 pbw), Epoxy 8 (5 pbw) and Epoxy 10 (3 pbw) as the epoxy resin, Curing agent 1 (44.0 pbw) as the curing agent, and Organic solvent 2 (35 pbw) as the organic solvent were mixed and stirred for approximately 90 minutes, followed by adding thereto Accelerator 1 (0.13 pbw) as the curing accelerator and stirring them for 30 minutes to yield a varnish.

Example 3

Epoxy 3 (118.8 pbw), Epoxy 9 (5 pbw), and Epoxy 10 (5 pbw) as the epoxy resin, Curing agent 2 (34.2 pbw) as the curing agent, and Organic solvent 1 (8 pbw), Organic solvent 2 (17.6 pbw), and Organic solvent 3 (25.6 parts by weigh) as the organic solvent were mixed and stirred for approximately 90 minutes, followed by adding thereto Accelerator 1 (0.13 pbw) as the curing accelerator and stirring them for 30 minutes to yield a varnish.

Example 4

Epoxy 4 (118.8 pbw) and Epoxy 8 (5 pbw) as the epoxy resin, Curing agent 3 (29.2 pbw) as the curing agent, and Organic solvent 2 (22.9 pbw) as the organic solvent were mixed and stirred for approximately 90 minutes, followed by adding thereto Accelerator 1 (0.13 pbw) as the curing accelerator and stirring them for 30 minutes to yield a varnish.

Example 5

Epoxy 5 (93.8 pbw) and Epoxy 7 (25 pbw) as the epoxy resin, Curing agent 1 (38.6 pbw) as the curing agent, and Organic solvent 1 (8 pbw), Organic solvent 2 (19 pbw), and Organic solvent 3 (19 pbw) as the organic solvent were mixed and stirred for approximately 90 minutes, followed by adding thereto Accelerator 1 (0.13 pbw) as the curing accelerator and stirring them for 30 minutes. Then, Inorganic filler 1 (15 pbw per 100 pbw of solid resin) as the inorganic filler was added with stirring. After stirring them for 90 minutes, the mixture was ground in a NanoMill□ grinding mill to uniformly disperse the inorganic filler in the varnish, yielding a varnish.

Example 6

Epoxy 2 (112.5 pbw) and Epoxy 7 (10 pbw) as the epoxy resin, Curing agent 1 (39.5 pbw) as the curing agent, and Organic solvent 2 (25 pbw) and Organic solvent 3 (25 pbw) as the organic solvent were mixed and stirred for approximately 90 minutes, followed by adding thereto Accelerator 1 (0.13 pbw) as the curing accelerator and stirring them for 30 minutes. Then, Inorganic filler 2 (15 pbw per 100 pbw) as the inorganic filler was added with stirring. After stirring them for 90 minutes, the mixture was ground in a NanoMill□ grinding mill to uniformly disperse the inorganic filler in the varnish, yielding a varnish.

Example 7

The varnish was prepared similarly to Example 5 except for replacement of Inorganic filler 1 as the inorganic filler with Inorganic filler 3.

Comparative Example 1

Epoxy 3 (106 pbw) and Epoxy 11 (15 pbw) as the epoxy resin, Curing agent 1 (44.8 pbw) as the curing agent, and Organic solvent 1 (26 pbw) and Organic solvent 2 (10 pbw) as the organic solvent were mixed and stirred for approximately 90 minutes, followed by adding thereto Accelerator 1 (0.13 pbw) as the curing accelerator and stirring them for 30 minutes to yield a varnish.

Comparative Example 2

Epoxy 6 (118.8 pbw) and Epoxy 8 (5 pbw) as the epoxy resin, Curing agent 1 (41.7 pbw) as the curing agent, and Organic solvent 2 (33.3 pbw) as the organic solvent were mixed and stirred for approximately 90 minutes, followed by adding thereto Accelerator 1 (0.13 pbw) as the curing accelerator and stirring them for 30 minutes to yield a varnish.

Comparative Example 3

Epoxy 6 (125 pbw) as the epoxy resin, Curing agent 2 (21 pbw) as the curing agent, and Organic solvent 1 (30 pbw) and Organic solvent 2 (10 pbw) as the organic solvent were mixed and stirred for approximately 90 minutes, followed by adding thereto Accelerator 1 (0.13 pbw) as the curing accelerator and stirring them for 30 minutes to yield a varnish.

Comparative Example 4

Epoxy 6 (106 pbw) and Epoxy 11 (15 pbw) as the epoxy resin, Curing agent 4 (2.5 pbw) as the curing agent, and Organic solvent 1 (13 pbw), Organic solvent 2 (10.6 pbw), and Organic solvent 3 (23.6 pbw) as the organic solvent were mixed and stirred for approximately 90 minutes, followed by adding thereto Accelerator 1 (0.05 pbw) as the curing accelerator and stirring them for 30 minutes to yield a varnish.

Manufacturing Method of Prepreg for Printed Wiring Board

Prepregs for printed wiring board, in semi-cured state (B-stage), were prepared by impregnating a glass cloth 0.2 mm thick (Nitto Boseki Co., "WEVA7628") with the varnish of the resin composition for printed wiring board according to Examples 1 to 7 and Comparative Examples 1 to 4, followed by drying them in an oven (120-180° C.) so as to provide a curing time of the prepreg within 60 seconds to 180 seconds and an impregnated resin amount of either 40% by weight or 46% by weight.

Manufacturing Method of Copper Clad Laminated Board

A copper foil was placed on both sides of either four sheets or eight sheets of the prepreg with 40% by weight of the impregnated resin for the printed wiring board obtained as mentioned above, followed by hot-pressing them at 140 to 180° C. under 0.98 to 3.9 MPa through laminate molding with a press machine to yield copper clad laminated boards with thickness of 0.8 mm and 1.6 mm, respectively.

In this process, the heating time during laminate molding was set such that the time of the temperature of the whole prepreg for printed wiring board becoming 160° C. or higher is at least 60 minutes or longer. As a copper foil, a "GT" foil (thickness, 18 μm) from Furukawa Circuit Foil Co. was used.

Physical properties of the prepregs for printed wiring board and copper clad laminated boards thus obtained were evaluated as follows. The results are shown in Table 1.

Appearance of Prepreg (PP)

Appearance of the product impregnated with 46% by weight of the resin obtained by the above manufacturing method of prepreg for printed wiring board was visually inspected.

Glass Transition Temperature

A copper foil of the copper-clad laminated board obtained as above was remove by etching, and the glass transition temperature of the product was measured with a differential scanning calorimetric (DSC) method according to IPC-TM-650 2.4.25.

The product with a glass transition temperature of 125° C. or higher was judged as good and shown as an open circle ("○").

Fire Retardancy

After a copper foil on the surface of the copper-clad laminated board 0.8 mm thick was removed by etching, the board was cut into 125 mm long and 13 mm wide to a specimen, which was evaluated by the vertical burn test according to the UL method (UL 94) in order to evaluate its fire retardancy.

Moldability

Prepregs (amount of impregnated resin, 40%) with the different curing time were prepared by the manufacturing method of prepreg for printed wiring board as mentioned above and used to prepare the copper clad laminated board according to the manufacturing method of laminated board for printed wiring board as mentioned above. Subsequently, the copper foil was removed by etching and the occurrence of both voids and smears were inspected. Absence of voids or smears in a wide range of the curing time indicates excellent moldability. The moldability is rated good and shown as an open circle ("○") for the product good in a range of 120 seconds for the curing time; whereas if it is rated fair, it is given a triangle ("□") for the product good in a range of 100 seconds for the curing time.

Measurement of Curing Time

The prepreg prepared as mentioned above was rubbed to loosen to form powder (passed through a 60 mesh filter in order to remove foreign particles such as glass fibers and others), and its curing time was measured according to JIS C65215.7.

Coefficient of Thermal Expansion

A copper foil of the copper-clad laminated board 1.6 mm thick prepared as mentioned above was removed by etching, and the coefficient of thermal expansion was measured with a thermomechanical analytical (TMA) method according to IPC-TM-6502.4.24.

Heat Resistance in Oven

The heat resistance in an oven for the copper-clad laminated board obtained as mentioned above was evaluated according to JIS-C6481.

Thermal Decomposition Temperature

After a cooper foil of the copper-clad multiplayer board obtained as mentioned above was removed by etching, and a specimen was heated at a temperature elevating rate of 10° C. with a thermogravimetric/differential thermal analytical (TG/DTA) method. The thermal decomposition temperature is referred to the temperature, at which the specimen weight is lost by 5% by weight.

TABLE 1

|  |  | Example 1 | Example 2 | Example 3 | Example 4 |
|---|---|---|---|---|---|
| Epoxy resin | Epoxy (a) | Epoxy 1 (112.5 pbw) | Epoxy 2 (118.8 pbw) | Epoxy 3 (118.8 pbw) | Epoxy 4 (118.8 pbw) |
|  | Epoxy (b) | Epoxy 7 (10 pbw) | Epoxy 8 (5 pbw) | Epoxy 9 (5 pbw) | Epoxy 8 (5 pbw) |
|  |  | — | Epoxy 10 (3 pbw) | Epoxy 10 (5 pbw) | — |
| Curing agent |  | Curing agent 1 (39.5 pbw) | Curing agent 1 (44.0 pbw) | Curing agent 2 (34.2 pbw) | Curing agent 3 (29.2 pbw) |
| Curing accelerator |  | Accelerator 1 (0.13 pbw) | Accelerator 1 (0.13 pbw) | Accelerator 1 (0.13 pbw) | Accelerator 1 (0.13 pbw) |
| Organic solvent |  | Organic solvent 2 (18.6 pbw) | Organic solvent 2 (35 pbw) | Organic solvent 1 (8 pbw) Organic solvent 2 (17.6 pbw) Organic solvent 3 (25.6 pbw) | Organic solvent 2 (22.9 pbw) Organic solvent 3 (22.9 pbw) |
| Inorganic filler |  | — | — | — | — |
| Ratio of epoxy (a) + epoxy (b) as a solid content per whole epoxy resin |  | 100% | 97% | 95% | 100% |
| Proportion of epoxy (a) as solid content per whole epoxy resin |  | 90% | 92% | 90% | 95% |
| Bromine content (%) in epoxy resin |  | 23% | 18.4% | 18.1% | 19% |
| Appearance of prepreg |  | Good | Good | Good | Good |
| Glass transition temperature |  | ○(135□) | ○(135□) | ○(130□) | ○(132□) |
| Fire retardancy |  | V-0 | V-0 | V-0 | V-0 |
| Moldability |  | ○ | ○ | □ | ○ |
| Curing time for prepreg (second) | 60 seconds | ○ | ○ | x | ○ |
|  | 80 seconds | ○ | ○ | ○ | ○ |
|  | 100 seconds | ○ | ○ | ○ | ○ |
|  | 140 seconds | ○ | ○ | ○ | ○ |
|  | 180 seconds | ○ | ○ | ○ | ○ |
| Coefficient of thermal expansion (αz1) |  | 65 ppm | 65 ppm | 65 ppm | 65 ppm |
| Heat resistance in oven |  | 270□ | 270□ | 265□ | 270□ |
| Thermal decomposition temperature (weight loss by 5%) |  | 355□ | 355□ | 350□ | 355□ |

|  |  | Example 5 | Example 6 | Example 7 | Comparative example 1 |
|---|---|---|---|---|---|
| Epoxy resin | Epoxy (a) | Epoxy 5 (93.8 pbw) | Epoxy 2 (112.5 pbw) | Epoxy 5 (93.8 pbw) | Epoxy 3 (106 pbw) |
|  | Epoxy (b) | Epoxy 7 (25 pbw) | Epoxy 7 (10 pbw) | Epoxy 7 (25 pbw) | — |
|  |  | — | — | — | Epoxy 11 (15 pbw) |
| Curing agent |  | Curing agent 1 (38.6 pbw) | Curing agent 1 (39.5 pbw) | Curing agent 1 (38.6 pbw) | Curing agent 1 (44.8 pbw) |
| Curing accelerator |  | Accelerator 1 (0.13 pbw) | Accelerator 1 (0.13 pbw) | Accelerator 1 (0.13 pbw) | Accelerator 1 (0.13 pbw) |
| Organic solvent |  | Organic solvent 1 (8 pbw) Organic solvent 2 (19 pbw) Organic solvent 3 (19 pbw) | Organic solvent 2 (25 pbw) Organic solvent 3 (25 pbw) | Organic solvent 1 (8 pbw) Organic solvent 2 (19 pbw) Organic solvent 3 (19 pbw) | Organic solvent 1 (26 pbw) Organic solvent 2 (10 pbw) |
| Inorganic filler |  | Inorganic filler 1 (19 pbw) | Inorganic filler 2 (63.8 pbw) | Inorganic filler 3 (19 pbw) | — |
| Ratio of epoxy (a) + epoxy (b) as a solid content per whole epoxy resin |  | 100% | 100% | 100% | 85% |
| Proportion of epoxy (a) as solid content per whole epoxy resin |  | 75% | 90% | 75% | 85% |

TABLE 1-continued

| | | | | |
|---|---|---|---|---|
| Bromine content (%) in epoxy resin | 27% | 23% | 27% | 16.2 |
| Appearance of prepreg | Good | Good | Good | Lack of resin uniformity |
| Glass transition temperature | ○(135□) | ○(134□) | x(105□) | ○(143□) |
| Fire retardancy | V-0 | V-0 | V-0 | V-0 |
| Moldability | ○ | ○ | ○ | ○ |
| Curing time for prepreg (second) 60 seconds | ○ | ○ | ○ | ○ |
| 80 seconds | ○ | ○ | ○ | ○ |
| 100 seconds | ○ | ○ | ○ | ○ |
| 140 seconds | ○ | ○ | ○ | ○ |
| 180 seconds | ○ | ○ | ○ | ○ |
| Coefficient of thermal expansion (αz1) | 55 ppm | 45 ppm | 55 ppm | 65 ppm |
| Heat resistance in oven | 270□ | 270□ | 279□ | 265□ |
| Thermal decomposition temperature (weight loss by 5%) | 355□ | 355□ | 355□ | 350□ |

| | | Comparative example 2 | Comparative example 3 | Comparative example 4 |
|---|---|---|---|---|
| Epoxy resin | Epoxy (a) | Epoxy 6 (118.8 pbw) | Epoxy 6 (125 pbw) | Epoxy 6 (106 pbw) |
| | Epoxy (b) | Epoxy 8 (5 pbw) | — | — |
| | | — | — | Epoxy 11 (15 pbw) |
| Curing agent | | Curing agent 1 (41.7 pbw) | Curing agent 2 (21 pbw) | Curing agent 4 (2.5 pbw) |
| Curing accelerator | | Accelerator 1 (0.13 pbw) | Accelerator 1 (0.13 pbw) | Accelerator 1 (0.05 pbw) |
| Organic solvent | | Organic solvent 2 (33.3 pbw) | Organic solvent 1 (30 pbw) Organic solvent 2 (10 pbw) | Organic solvent 1 (13 pbw) Organic solvent 2 (10.6 pbw) Organic solvent 4 (23.6 pbw) |
| Inorganic filler | | — | — | — |
| Ratio of epoxy (a) + epoxy (b) as a solid content per whole epoxy resin | | 100% | 100% | — |
| Proportion of epoxy (a) as solid content per whole epoxy resin | | 95% | 100% | — |
| Bromine content (%) in epoxy resin | | 19% | 20% | — |
| Appearance of prepreg | | Good | Some non-uniformity with resin | Good |
| Glass transition temperature | | x(122□) | x(120□) | ○(135□) |
| Fire retardancy | | V-0 | V-0 | V-0 |
| Moldability | | ○ | □ | ○ |
| Curing time for prepreg (second) 60 seconds | | ○ | x | ○ |
| 80 seconds | | ○ | ○ | ○ |
| 100 seconds | | ○ | ○ | ○ |
| 140 seconds | | ○ | ○ | ○ |
| 180 seconds | | ○ | ○ | ○ |
| Coefficient of thermal expansion (αz1) | | 65 ppm | 65 ppm | 65 ppm |
| Heat resistance in oven | | 265□ | 265□ | 240□ |
| Thermal decomposition temperature (weight loss by 5%) | | 350□ | 350□ | 310□ |

The brominated epoxy resins obtained by reaction of a bisphenol A type epoxy resin with tetrabromobisphenol A.

Epoxy 1: Dow Chemical Co., DER530A80, epoxy equivalent=427 g/eq and the n=0 component=28%

Epoxy 2: WUXI DIC EPOXY Co. Ltd., Epiclon 1320A80, epoxy equivalent=430 g/eq and the n=0 component=26%.

Epoxy 3: Chan Cheng Synthetic Co., BEB530A80, epoxy equivalent=438 g/eq and the n=0 component=27%.

Epoxy 4: Grace Co., GER454A80, epoxy equivalent=435 g/eq and the n=0 component=27%.

Epoxy 5: Dow Chemical Co., DER539A80, epoxy equivalent=450 g/eq and the n=0 component=21%.

Epoxy 6: Dainippon Ink and Chemical Industries Co., Epiclon 1120-80M, epoxy equivalent=500 g/eq and the n=0 component=17%.

The bifunctional epoxy resins obtained by reaction of any one of bisphenol A, bisphenol F or tetrabromobisphenol A with epichlorohydrin.

Epoxy 7: Dainippon Ink and Chemical Industries Co., Epiclon 153 brominated epoxy resin, epoxy equivalent=400 g/eq and the n=0 component=68%.

Epoxy 8: Dainippon Ink and Chemical Industries Co., Epiclon 840S bisphenol A type epoxy resin, epoxy equivalent=190 g/eq and the n=0 component=86%.

Epoxy 9: Dainippon Ink and Chemical Industries Co., Epiclon 830S bisphenol F type epoxy resin, epoxy equivalent=170 g/eq and the n=0 component=78%.

Other epoxy resins.

Epoxy 10: Shell Chemical Co., EPON Resin 1031 tetrafunctional epoxy resin, epoxy equivalent=212 g/eq.

Epoxy 11: Toto Chemical Co., YDCN-704 cresol novolac type epoxy resin, epoxy equivalent=220 g/eq.

Curing agents
Curing agent 1: Japan Epoxy Resin Co., YLH129B70 bisphenol A type novolac resin, bifunctional component=17-19% and equivalent of hydroxyl group=118 g/eq.
Curing agent 2: Dainippon Ink and Chemical Industries Co., TD-2093 phenol novolac resin, bifunctional component=7-8% and equivalent of hydroxyl group=105 g/eq.
Curing agent 3: Dainippon Ink and Chemical Industries Co., VH-4170 bisphenol A type novolac resin, bifunctional component=25% and equivalent of hydroxyl group=118 g/eq.
Curing agent 4: Dicyandiamide, reagent grade, theoretical equivalent of active hydrogen=21 g/eq.

Curing accelerator

Accelerator 1: Shikoku Chemical Corp., 2-ethyl-4-methylimidazole.
Fillers
Inorganic filler 1: E-glass powder
Inorganic filler 2: Silica
Inorganic filler 3: Talc
Organic solvents
Organic solvent 1: Methyl ethyl ketone
Organic solvent 2: Methoxypropanol
Organic solvent 3: Cyclohexanone
Organic solvent 4: Dimethylformamide As shown in Table 1, it is confirmed that, through using the epoxy resin containing both the epoxy (a): a brominated epoxy resin, obtainable by reacting/mixing a bisphenol A epoxy resin with tetrabromobisphenol A, and having an epoxy equivalent of 350 g/eq to 470 g/eq and an n=0 component content of 20% to 35% in terms of area percentage in a GPC chart; and the epoxy (b): one or more of bifunctional epoxy resins, obtainable by reacting epichlorohydrin with any one of bisphenol A, bisphenol F and tetrabromobisphenol A, and having an n=0 component of 60% or higher in term of area percentage in a GPC chart; in such amounts of the total content of the epoxy (a) and the epoxy (b) in the range of 80% to 100% by weight, preferably 93% to 100% by weight, the content of the epoxy (a) in the range of 75% to 97% by weight, and the bromine content in the range of 18% to 30% by weight, based on the total weight of the epoxy resin; there has been attained, in Examples 1 to 7, improved appearance of the prepreg together with assuring sufficient fire retardancy and glass transition temperature required for the general purpose epoxy resin laminated board, as compared with the following Comparative Examples:

Comparative Example 1, not formulated with the epoxy (b) obtained by reacting any one of bisphenol A, bisphenol F and tetrabromobisphenol A with epichlorohydrin and containing the n=0 component with the relative area of 60% or more in the GPC;

Comparative Example 2, formulated with a brominated epoxy resin which does not fall under the epoxy (a) obtained by mixing/reacting a bisphenol A type epoxy resin with tetrabromobisphenol A and possessing an epoxy equivalent from 350 g/eq to 470 g/eq and the n=0 component with the relative area from 20% to 35% in the GPC; and Comparative Example 3, formulated with a brominated epoxy resin which does not fall under the epoxy (a) obtained by mixing and reacting the bisphenol A type epoxy resin with tetrabromobisphenol A and possessing the epoxy equivalent from 350 g/eq to 470 g/eq and the component n=0 with the relative area from 20% to 35% in the GPC, and not formulated with the epoxy (b): a bifunctional epoxy resin obtained by reacting any one of bisphenol A, bisphenol F or tetrabromobisphenol A with epichlorohydrin and containing the n=0 component with the relative area of 60% or higher in the GPC.

Furthermore, it is also shown that heat resistance such as the thermal decomposition temperature and heat resistance in an oven in Examples 1 to 7 are superior as compared with those in Comparative Example 4 with the DICY curing system.

It is also confirmed from the results with the moldability that Examples 1, 2, and 4 to 7 using the phenol novolac resin obtained by reacting any one of phenol, cresol and bisphenol A with an aldehyde and possessing the bifunctional component between 15% and 30% is superior in the moldability as compared with Example 3 using the phenol novolac resin not applicable to the above.

In addition, it is confirmed from the results with measurement of heat expansion that the coefficient of thermal expansion in Examples 5, 6 and 7 formulated with the inorganic filler results in decrease as compared with the one in Examples 1 to 4 without any inorganic filler.

In addition, the results in measurement of the glass transition temperature and heat expansion indicates that the glass transition temperature in Examples 5 and 6 using glass powder or silica does not decrease.

The invention claimed is:

1. An epoxy resin composition for a printed wiring board, comprising:
   an epoxy resin, a phenol novolac resin and a curing accelerator,
   said epoxy resin comprises an epoxy (a) and an epoxy (b),
   wherein the epoxy (a) is a brominated epoxy resin, obtainable by reacting a bisphenol A epoxy resin with tetrabromobisphenol A, said brominated epoxy resin having an epoxy equivalent of 350 g/eq to 470 g/eq and containing an n=0 component in a ratio of 20% to 35% in terms of area percentage in a GPC chart; and
   the epoxy (b) is one or more of bifunctional epoxy resins, obtainable by reacting epichlorohydrin with any one selected from the group consisting of bisphenol A, bisphenol F and tetrabromobisphenol A, said bifunctional epoxy resins having an n=0 component in a content of 60% or higher in terms of area percentage in a GPC chart;
   said epoxy (a) and epoxy (b) are contained in total in an amount of 93% to 100% by weight, based on the total weight of the epoxy resin;
   said epoxy (a) is contained in an amount of 75% to 97% by weight, based on the total weight of the epoxy resin; and
   said epoxy resin has a bromine content of 18% to 30% by weight, based on the total weight of the epoxy resin.

2. An epoxy resin composition for a printed wiring board according to claim 1, characterized in that the phenol novolac resin is a phenol novolac resin, obtainable by reacting formaldehyde with one selected from the group consisting of phenol, cresol and bisphenol A; said phenol novolac resin containing a bifunctional component in an amount of 15% to 30%.

3. An epoxy resin composition for a printed wiring board according to claim 2, characterized in that an inorganic filler is contained.

4. A prepreg for a printed wiring board, characterized in that the prepreg is obtainable by impregnating a glass cloth with a varnish comprising an organic solvent and an epoxy resin composition for a printed wiring board according to claim 2 and drying the vanish to B-stage.

5. An epoxy resin composition for a printed wiring board according to claim 1, characterized in that an inorganic filler is contained.

6. An epoxy resin composition for a printed wiring board described in claim 5, characterized in that a glass powder and/or silica filler is contained.

7. A prepreg for a printed wiring board, characterized in that the prepreg is obtainable by impregnating a glass cloth with a varnish comprising an organic solvent and an epoxy resin composition for a printed wiring board according to claim 6 and drying the vanish to B-stage.

8. A prepreg for a printed wiring board, characterized in that the prepreg is obtainable by impregnating a glass cloth with a varnish comprising an organic solvent and an epoxy resin composition for a printed wiring board according to claim 5 and drying the vanish to B-stage.

9. A prepreg for a printed wiring board, characterized in that the prepreg is obtainable by impregnating a glass cloth with a varnish comprising an organic solvent and an epoxy resin composition for a printed wiring board according to claim 1 and drying the vanish to B-stage.

10. A laminated board for a printed wiring board, a printed wiring board or a laminated printed wiring board, characterized in that a prepreg for a printed wiring board according to claim 9 is used for the preparation thereof.

11. The epoxy resin composition of claim 1, wherein the epoxy (a) has an epoxy equivalent of 427 g/eq to 470 g/eq.

12. The epoxy resin composition of claim 1, wherein said epoxy (a) is contained in an amount of 79% to 96% by weight based on the total weight of the epoxy resin.

13. An epoxy resin composition for a printed wiring board, comprising:
   an epoxy resin, a phenol novolac resin and a curing accelerator,
   said epoxy resin comprises an epoxy (a) and an epoxy (b),
   wherein the epoxy (a) is a brominated epoxy resin, obtainable by reacting/mixing a bisphenol A epoxy resin with tetrabromobisphenol A, said brominated epoxy resin having an epoxy equivalent of 350 g/eq to 470 g/eq and containing an n=0 component in a ratio of 20% to 35% in terms of area percentage in a GPC chart; and
   the epoxy (b) is one or more of bifunctional epoxy resins, obtainable by reacting epichlorohydrin with any one selected from the group consisting of bisphenol A, bisphenol F and tetrabromobisphenol A, said bifunctional epoxy resins having an n=0 component in a content of 60% or higher in terms of area percentage in a GPC chart;
   said epoxy (a) and epoxy (b) are contained in total in an amount of 80% to 100% by weight, based on the total weight of the epoxy resin;
   said epoxy (a) is contained in an amount of 91.8% to 96% by weight, based on the total weight of the epoxy resin; and
   said epoxy resin has a bromine content of 18% to 30% by weight, based on the total weight of the epoxy resin.

14. An epoxy resin composition for a printed wiring board, comprising:
   an epoxy resin, a phenol novolac resin and a curing accelerator,
   said epoxy resin comprises an epoxy (a) and an epoxy (b)
   wherein the epoxy (a) is a brominated epoxy resin, obtainable by reacting/mixing a bisphenol A epoxy resin with tetrabromobisphenol A, said brominated epoxy resin having an epoxy equivalent of 350 g/eq to 470 g/eq and containing an n=0 component in a ratio of 20% to 35% in terms of area percentage in a GPC chart; and
   the epoxy (b) is one or more of bifunctional epoxy resins, obtainable by reacting epichlorohydrin with any one selected from the group consisting of bisphenol A, bisphenol F and tetrabromobisphenol A, said bifunctional epoxy resins having an n=0 component in a content of 60% or higher in terms of area percentage in a GPC chart;
   said epoxy (a) and epoxy (b) are contained in total in an amount of 80% to 100% by weight, based on the total weight of the epoxy resin;
   said epoxy (a) is contained in an amount of greater than 75% up to 97% by weight, based on the total weight of the epoxy resin; and
   said epoxy resin has a bromine content of 18% to 30% by weight, based on the total weight of the epoxy resin.

* * * * *